(12) United States Patent
Laprade et al.

(10) Patent No.: US 7,904,784 B2
(45) Date of Patent: *Mar. 8, 2011

(54) SERIAL CONCATENATED CONVOLUTIONAL CODE DECODER

(75) Inventors: Maria Laprade, Palm Bay, FL (US); Matthew C. Cobb, W. Melbourne, FL (US); Timothy F. Dyson, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 967 days.

This patent is subject to a terminal disclaimer.

(21) Appl. No.: 11/685,919

(22) Filed: Mar. 14, 2007

(65) Prior Publication Data

US 2008/0229171 A1   Sep. 18, 2008

(51) Int. Cl.
*H03M 13/00* (2006.01)
(52) U.S. Cl. .................. 714/755; 714/784; 714/786
(58) Field of Classification Search .................. 714/755, 714/784, 786
See application file for complete search history.

(56) References Cited

U.S. PATENT DOCUMENTS

| | | | |
|---|---|---|---|
| 6,029,264 A | 2/2000 | Kobayashi et al. | |
| 6,202,189 B1 * | 3/2001 | Hinedi et al. | 714/786 |
| 6,263,466 B1 * | 7/2001 | Hinedi et al. | 714/755 |
| 6,323,788 B1 * | 11/2001 | Kim et al. | 341/81 |
| 6,775,800 B2 * | 8/2004 | Edmonston et al. | 714/755 |
| 6,789,218 B1 * | 9/2004 | Edmonston et al. | 714/701 |
| 6,983,412 B2 * | 1/2006 | Fukumasa | 714/755 |
| 7,093,179 B2 | 8/2006 | Shea | |
| 7,200,798 B2 * | 4/2007 | Bickerstaff | 714/794 |
| 7,302,621 B2 * | 11/2007 | Edmonston et al. | 714/702 |
| 7,673,213 B2 * | 3/2010 | Chugg et al. | 714/755 |
| 7,770,087 B2 | 8/2010 | Laparade et al. | |
| 2005/0229087 A1 | 10/2005 | Kim et al. | |

OTHER PUBLICATIONS

U.S. Appl. No. 11/685,849, Laprade et al.
U.S. Appl. No. 11/931,156, Laprade et al.
U.S. Appl. No. 11/744,440, Laprade et al.
Benedetto, et al., "A Soft-Input Soft-Output APP Module for Iterative Decoding of Concatenated Codes," IEEE Comm. Letters, vol. 1, No. 1, Jan. 1997 pp. 22-24.
Benedetto, et al., "Serial Concatenation of Interleaved Codes: Performance Analysis, Design, and Iterative Decoding," IEEE Transactions on Information Theory, vol. 44, No. 3, May 1998, pp. 909-926.
Garello, et al., "Computing the Free Distance of Turbo Codes and Serially Concatenated Codes with Interleavers: Algorithms and Applications," IEEE Jnl on Selected Areas in Communications, vol. 19, No. 5, May 2001, pp. 800-812.

(Continued)

*Primary Examiner* — Esaw T Abraham
(74) *Attorney, Agent, or Firm* — Fox Rothschild, LLP; Robert J. Sacco

(57) ABSTRACT

A serial concatenated convolutional code (SCCC) decoder is provided. The SCCC decoder includes an input buffer memory one or more processing loop modules, and an output buffer memory. Each processing loop module includes a permutation module, inner decoding engines, a depermutation module, and outer decoding engines. The depermutation module includes a concatenating device and two or more depermutation buffer memories. The concatenating device is configured for writing a codeword segment containing a plurality of soft-decision bits to each of the depermutation buffer memories in a single write operation. The permutation module also includes a concatenating device and two or more permutation buffer memories. The concatenating device is configured for writing a codeword segment containing a plurality of soft-decision bits to each of the depermutation buffer memories in a single write operation.

22 Claims, 10 Drawing Sheets

OTHER PUBLICATIONS

Bosco, et al., "A New Algorithm for 'Hard' Iterative Decoding of Concatenated Codes," IEEE Transactions on Communications, vol. 51, No. 8, Aug. 2003, pp. 1229-1232.

Benedetto, et al., "Serial Concatenation of Block and Convolutional Codes," Electronics Letters, May 9, 1996, vol. 32, No. 10, pp. 887-888.

Benedetto, et al., "Iterative decoding of serially concatenated convolutional codes," Electronics Letters, Jun. 20, 1996, vol. 32, No. 13, pp. 1186-1188.

Benedetto, et al., "Concatenated codes with interleaver for digital transmission over mobile channels," IEEE International Conference on Communications, 2001. ICC 2001, ICC 2001. Jun. 11-14, 2001, pp. 3026-3030, vol. 10.

Scanavino, et al., "Convergance properties of iterative decoders working at bit and symbol level," Global Telecommunications Conference, 2001, IEEE vol. 2, Nov. 25-29, 2001, pp. 1037-1041.

Benedetto, et al., "On the Design of Binary Serially Concatenated Convolutional Codes," Communication Theory Mini-Conference, 1999, Jun. 6-10, 1999, pp. 32-36.

Benedetto et al., "Serial Concatenated Trellis Coded Modulation with Iterative Decoding," Proceedings, 1997, IEEE International Symposium on Information Theory. Jun. 29-Jul. 4, 1997, p. 8.

Benedetto, et al., "Serial concatenation of interleaved codes: performance analysis, design and iterative decoding," IEEE International Symposium on Information Theory, 1997 Proceedings. p. 106.

Benedetto, et al., "Serial concatenation of interleaved codes: analytical performance bounds," Global Telecommunications Conf., 1996. "Communications: The Key to Global Prosperity," vol. 1, Nov. 18-22, 1996, pp. 106-110.

Chandran, "MAP Algorithm FAQ," found on the WWW at <<http://www.ittc.ku.edu/~rvc/projects/faq/map.htm>> printed on Feb. 5, 2007.

* cited by examiner

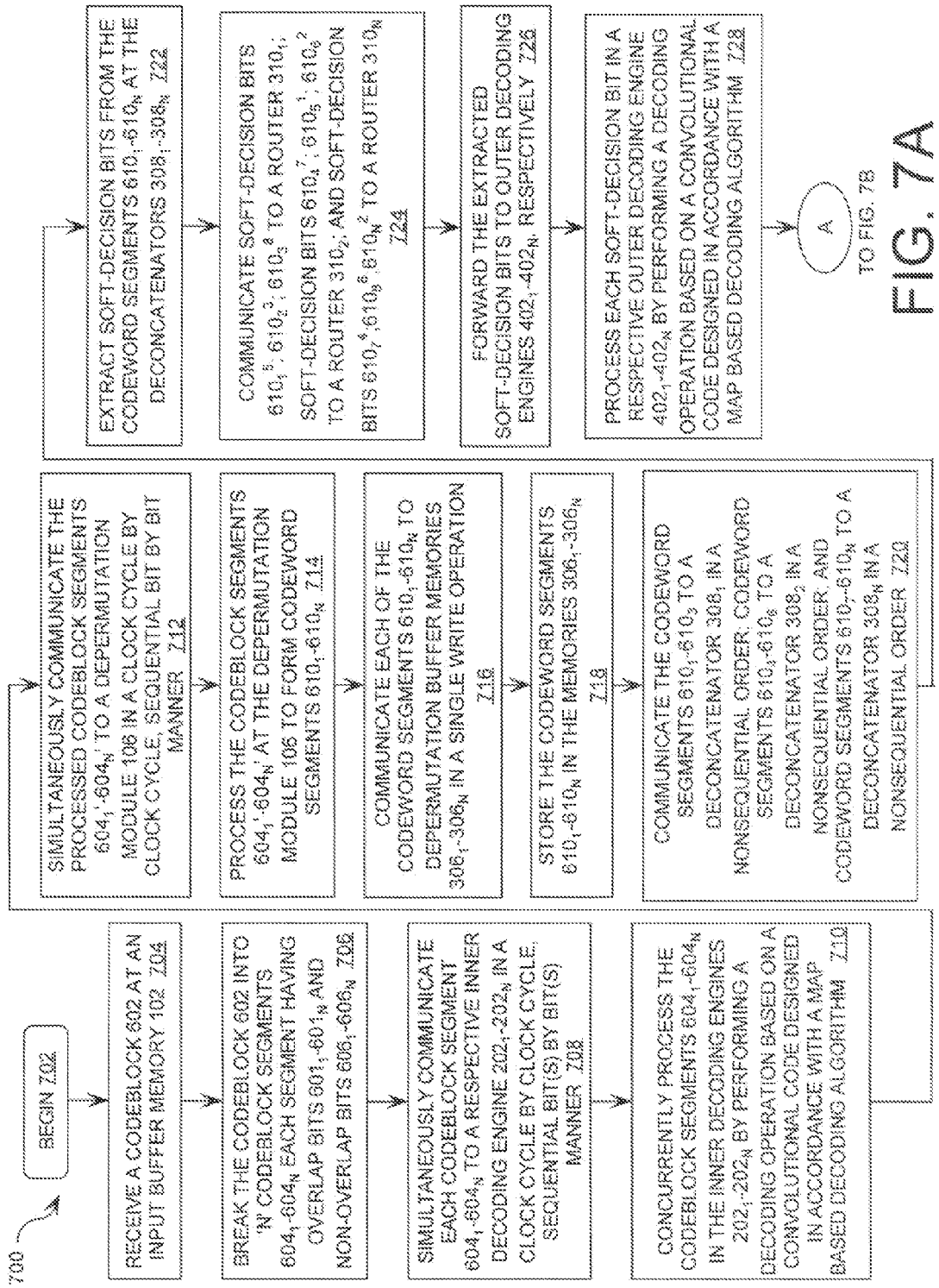

SERIAL CONCATENATED CONVOLUTIONAL CODE DECODER

STATEMENT REGARDING FEDERALLY SPONSORED RESEARCH OR DEVELOPMENT

This invention was made with Government support under Contract No. FA8808-04-C-0022 awarded by the U.S. Air Force. The Government has certain rights in this invention.

BACKGROUND OF THE INVENTION

1. Statement of the Technical Field

The inventive arrangements relate to digital communication equipment using an error correction technique. More particularly, the inventive arrangements relate to a serial concatenated conventional code decoder.

2. Description of the Related Art

A serially concatenated convolutional code (SCCC) decoder provides a means for recovering information bits from a codeword. A codeword is often comprised of a bitstream that has been encoded using a forward error correction (FEC) technique based on at least one convolutional code. A codeword may be a relatively large sequence of information bits (for example, a few thousand information bits) to provide a high recoverability of encoded information contained therein.

One algorithm that is conventionally used in SCCC decoders for decoding coded sequences is the MAP algorithm. MAP is an acronym for the phrase "Maximum Aposteriori Probability." The MAP algorithm provides a method for determining the most probable information bits which were transmitted based on a noisy signal received over a communication channel. It is know in the art that the MAP algorithm is an inherently Soft-Input, Soft-Output (SISO) algorithm. Soft information refers to soft-values (which are represented by soft-decision bits) that comprise information about the bits contained in a coded sequence. In particular, soft-values are values that represent the probability that a particular bit in a coded sequence is either a one (1) or a zero (0). For example, a soft-value for a particular bit can indicate that a probability of a bit being a one (1) is p(1)=0.3. Conversely, the same bit can have a probability of being a zero (0) which is p(0)=0.7. The most commonly used soft values are log-likelihood ratios (LLR's). An LLR which is a positive value suggests that the bit is most likely to be a one (1) whereas a negative LLR suggests that the value of the bit is most likely a zero (0).

It is known that soft values can be used in SCCC devices for decoding concatenated codes. In general, concatenated codes use two codes (an inner code and an outer code) with some interleaving between them. Accordingly, SCCC decoders are commonly implemented with two separate decoders that are each utilizing MAP algorithms for the decoding process. An inner decoder decodes the inner code and an outer decoder decodes the outer code. The decoders are commonly configured for operation in an iterative process where the outputs of one decoder are repeatedly communicated to the other decoder. Since the MAP algorithm is a SISO type algorithm, the soft-values (represented by soft decision bits) generated by the MAP algorithm in one decoder can be used as inputs to the MAP algorithm in the other decoder.

During a first iteration of a concatenated code, an inner decoder processes soft-value approximations to bits output from an inner encoder. As a result of this processing, the inner decoder outputs soft-value approximations to the bits that were input to the inner encoder in an encoding process. Similarly, the outer decoder uses soft-value approximations to bits output from an outer encoder. Since the bits output from the outer encoder were permuted or interleaved (as explained in the preceding paragraph), the soft-value approximations are derived by applying a reverse permutation to the soft-value approximations output from the inner decoder prior to being communicated to the outer decoder. This reverse permutation is known in the ad as depermutation. The outer decoder can produce two different outputs. One is a soft-value approximation to data that was input to the outer encoder. This data is the original, unencoded data, and is not of interest until a final iteration. This data need not be permuted or depermuted. The other output of the outer decoder is a refinement to soft-value approximations to bits output from an outer encoder. This output is interleaved (i.e., re-arranged) in the same manner as an encoder permuted output bits of the outer encoder prior to communicating the bits to the inner encoder. These permuted soft-value approximation outputs from the outer decoder approximate the bits input to the inner encoder and can therefore be used in a second iteration of the decoding process.

During the second iteration of the decoding process, the permuted soft-value approximation outputs are communicated to the inner decoder. In this regard, it should be appreciated that the inner decoder uses the permuted soft-values approximations of bits input to the inner encoder to produce refined soft-value approximations of bits input to the inner encoder. The inner decoder also uses the soft-value approximations of bits output from the inner encoder to produce refined soft-value approximations of hits input to the inner encoder.

SCCC decoders are often implemented on field programmable gate arrays (FPGAs) or application specific integrated circuits (ASICs). In this regard, it should be understood that an SCCC decoder is typically designed to include an input buffer memory, a processing loop module, and an output buffer memory. The input butter memory is comprised of hardware and firmware configured to receive soft-decision bits from an external device and to temporarily store the same. The processing loop module is comprised of an inner decoder module, a depermutation buffer memory, an outer decoder module, and a permutation buffer memory. The burden of decoding information contained within a codeword is split between the inner decoder module and the outer decoder module.

The inner decoder module is comprised of hardware and firmware configured to read soft-decision bits, in a sequential or a non-sequential order, from different locations in the input buffer memory and/or the permutation module. In this regard, it should be appreciated that a non-sequential ordering of soft-decision bits causes a bottleneck or congestion of soft-decision bits at the inner decoder module. Upon receipt of the soft-decision bits, the inner decoder module begins processing the same. This processing typically involves performing a relatively simple decoding operation based on a corresponding convolutional inner code. After processing the soft-decision bits, the inner decoder module communicates the processed soft-decision bits, in a sequential or a non-sequential order, to the depermutation buffer memory for depermutation (i.e., rearrangement or reorganization) and storage. It should be understood that depermutation of soft-decision bits is necessary to reverse a permutation of soft-decision bits that occurred in an encoding process. It should also be understood that a non-sequential ordering of soft-decision bits causes a bottleneck or congestion of the soft-decision bits at the depermutation buffer memory.

The outer decoder module is comprised of hardware and firmware configured to retrieve depermuted soft-decision bits from the depermutation buffer memory. Upon receipt of soft-decision bits, the outer decoder module begins processing the received soft-decision bits. This processing typically involves performing a relatively simple decoding operation based on a corresponding convolutional outer code. After processing the soft-decision bits, the outer decoder module communicates the processed soft-decision bits, in a sequential or a non-sequential order, to the permutation buffer memory for permutation (i.e., rearrangement or reorganization) and storage. It should be understood that permutation is necessary to realign the soft-decision bits to the permutation that occurred in an encoding process. It should also be understood that a non-sequential ordering of soft-decision bits causes a bottleneck or congestion of the soft-decision bits at the permutation buffer memory. Thereafter, a sequence of permuted soft-decision bits is communicated, along with the original codeword, to the inner decoder module.

The above described process is performed for 'M' iterations. After 'M' iterations, the outer decoder module produces decoded information bits. Subsequently, the outer decoder module forwards the decoded information bits to the output buffer memory for storage.

Despite the advantages of such a conventional SCCC decoder, it suffers from certain drawbacks. For example, the above described decoding process requires a relatively large amount of time to complete. The above described decoding process also results in a bottleneck or congestion of the soft-decision bits at the inner decoder module, the depermutation buffer memory, and the permutation buffer memory. As such, there remains a need for a SCCC decoder having an improved processing time with a negligible performance loss. There also remains a need for a SCCC decoder absent of this bottleneck or congestion characteristic.

SUMMARY OF THE INVENTION

The invention concerns a method for serial concatenated convolutional decoding. The method includes receiving a codeblock at an input buffer memory and separating the codeblock into two or more codeblock segments. The method also includes concurrently communicating respective soft-decision bits from each of the codeblock segments to a respective one of a plurality of inner decoding engines. The method further includes concurrently processing the respective soft-decision bits at the inner decoding engines to generate at least one soft-decision bit from each of the inner decoding engines. The method includes concatenating a set of the soft-decision bits generated by the inner decoding engines to form a codeword segment. The method includes concurrently writing the codeword segment to two or more depermutation buffer memories.

According to an aspect of the invention, the method includes repeating the processing, concatenating, and writing steps to respectively generate and store one or more codeword segments so that each of the codeword segments is duplicated in each of the depermutation buffer memories. The method also includes depermuting the codeword segments. The method further includes extracting soft-decision bits from the codeword segments for two or more outer decoding engines. The depermuting step further comprises a plurality of memory read accesses. The memory read accesses are distributed among the depermutation buffer memories.

According to another aspect of the invention, the method includes communicating the soft-decision bits extracted from the codeword segments to the outer decoding engines. The method also includes concurrently processing the soft-decision bits in the outer decoding engines to generate at least one soft-decision bit from each of the outer decoding engines. The method further includes concatenating a set of the soft-decision bits generated by the outer decoding engines to form a codeword segment. The method includes concurrently writing the codeword segment to a plurality of permutation buffer memories.

According to yet another aspect of the invention, the method includes repeating the processing, concatenating, and writing steps to respectively generate and store two or more codeword segments so that each of the codeword segments is duplicated in each of the permutation buffer memories. The method also includes permuting the codeword segments. The method further includes extracting soft-decision bits from the codeword segments for the inner decoding engines. The permuting step further comprises a plurality of memory read accesses. The memory read accesses are distributed among the permutation buffer memories.

A serial concatenated convolutional code (SCCC) decoder is also provided. The SCCC decoder is comprised of an input buffer memory having a codeblock stored therein. The codeblock is comprised of two or more codeblock segments. The SCCC decoder is also comprised of two or more inner decoding engines. The inner decoding engines are configured to concurrently receive respective soft-decision bits from a respective one of the codeblock segments. The inner decoding engines are also configured to concurrently process the respective soft-decision bits to generate at least one soft-decision bit. The SCCC decoder is also comprised of a first concatenating device. The first concatenating device is configured to concatenate a set of soft-decision bits generated by the inner decoding engines to form a codeword segment. The first concatenating device is also configured to concurrently write the codeword segment to two or more depermutation buffer memories.

According to an aspect of the invention, the first concatenating device is also configured to generate two or more codeword segments. The first concatenating device is further configured to write the codeword segments to the depermutation buffer memories so that each of the codeword segments is duplicated in each of the depermutation buffer memories.

According to another aspect of the invention, the SCCC decoder is comprised of two or more first deconcatenating devices. These deconcatenating devices are configured to retrieve codeword segments from a respective one of the depermutation buffer memories. In this regard, it should be appreciated that the codeword segments are retrieved from the depermutation buffer memories in an order different from an order in which the codeword segments were written to the depermutation buffer memories for storage. These deconcatenating devices are also configured to extract soft-decision bits from the codeword segments for two or more outer decoding engines. These deconcatenating devices are further configured to communicate the soft-decision bits to the outer decoding engines. The outer decoding engines are configured to concurrently process the soft-decision bits to generate at least one soft-decision bit.

According to another aspect of the invention, the SCCC decoder is comprised of a second concatenating device. This concatenating device is configured to concatenate a set of soft-decision bits generated by the outer decoding engines to form a codeword segment. This concatenating device is also configured to concurrently write the codeword segment to two or more permutation buffer memories. The concatenating device is further configured to generate two or more codeword segments. The concatenating device is configured to write the codeword segments to the permutation buffer memories so that each of the codeword segments is duplicated in each of the permutation buffer memories.

According to yet another aspect of the invention, the SCCC decoder is comprised of two or more second deconcatenating devices. These deconcatenating devices are configured to retrieve two or more codeword segments from a respective one of the permutation buffer memories. In this regard, it should be appreciated that the codeword segments are retrieved from the permutation buffer memories in an order different from an order in which the codeword segments were written to the permutation buffer memories for storage. These deconcatenating devices are further configured to extract soft-decision bits from the codeword segments for the inner decoding engines.

BRIEF DESCRIPTION OF THE DRAWINGS

Embodiments will be described with reference to the following drawing figures, in which like numerals represent like items throughout the figures, and in which:

FIGS. 7A-7B collectively illustrate a method for serial concatenated convolutional decoding that is useful for understanding the invention.

DETAILED DESCRIPTION OF THE PREFERRED EMBODIMENTS

An embodiment of the present invention will now be described with respect to FIG. 1 through FIG. 7. Some embodiments of the present invention provide a serial concatenated convolutional code (SCCC) decoder having an improved parallel processing time feature with a negligible performance loss characteristic. In this regard, it should be appreciated that the SCCC decoder is comprised of an inner decoder module having N inner decoding engines (described below in relation to FIG. 2) and an outer decoder module having N outer decoding engines (described below in relation to FIG. 4). The N inner decoding engines are configured to concurrently process soft-decision bits thereby providing an improved processing time feature to the inner decoder module. Similarly, the N outer decoding engines are configured to concurrently process soft-decision bits thereby providing an improved processing time feature to the outer decoder module.

The present invention also provides an SCCC decoder absent of an information bit bottleneck or congestion characteristic. In this regard, it should be appreciated that a non-sequential ordering of soft-decision bits, as well as a requirement to simultaneously serve N inner/outer decoding engines, causes an information bit bottleneck or congestion characteristic at a depermutation/permutation buffer memory. The present invention solves this information bit bottleneck or congestion characteristic by implementing a different write and read method as compared to a conventional SCCC decoder. These read and write methods will be described in great detail below (in relation to FIG. 3, FIG. 5, and FIG. 6A through FIG. 6C).

Figure 1:
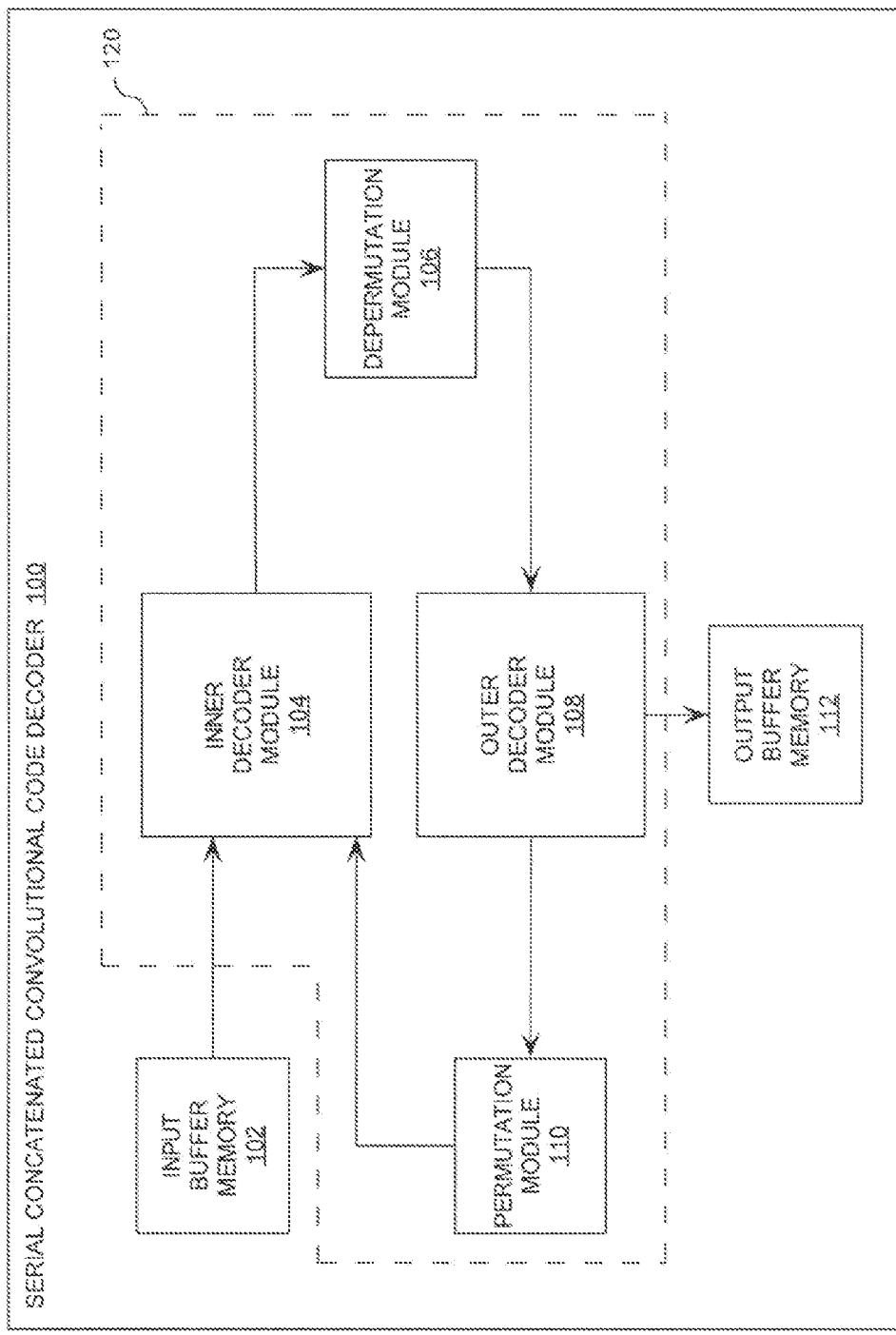
FIG. 1 is a block diagram of a serial concatenated convolutional code (SCCC) decoder that is useful for understanding the invention.

Referring now to FIG. 1, an SCCC decoder 100 is shown that is useful for understanding the invention. If should be understood that the SCCC decoder 100 is implemented on a programmable device, such as a field programmable gate array (FPGA) or an application specific integrated circuit (ASIC). According to an embodiment of the invention, the SCCC decoder 100 is advantageously selected as an FPGA having a model number XC2V8000 which is available from Xilinx, Inc., of San Jose, Calif. Still, the invention is not limited in this regard. Any programmable device having a substantially fast parallel processing time feature can be used without limitation.

As may be observed in FIG. 1, the SCCC decoder 100 is comprised of an input buffer memory 102, a processing loop module 120, and an output buffer memory 112. Although only a single input buffer memory 102, processing loop module 120, and output buffer memory 112 is shown in FIG. 1, it should be understood that the SCCC decoder 100 can be comprised of any number of these components 102, 120, 112. For example, the SCCC decoder 100 can be comprised of two (2) or more parallel processing loop modules 120.

Referring again to FIG. 1, the input buffer memory 102 provides a data store for soft-decision bits communicated from an external device (not shown) and received at the SCCC decoder 100. In this regard, if should be appreciated that the input buffer memory 102 provides a means for storing soft-decision bits in a codeblock format. Codeblock formats are well known to persons skilled in the art. Thus, codeblock formats will not be described in great detail herein. Also, methods for storing soft-decision bits in a codeblock format are well known by persons skilled in the art. In this regard. It should be appreciated that any such method can be used without limitation.

According to an embodiment of the invention, a codeblock is selected to include a relatively large amount of soft-decision bits. For example, the codeblock includes four thousand (4,000) soft-decision bits. Still, the invention is not limited in this regard. A codeblock can be selected to include any number of soft-decision bits in accordance with a particular SCCC decoder 100 application.

As shown in FIG. 1, the input buffer memory 102 is coupled to the processing loop module 120. The processing loop module 120 is comprised of hardware and firmware configured to retrieve a codeblock of soft-decision bits from the input buffer memory 102. The processing loop module 120 is also comprised of hardware and firmware configured to perform a decoding operation based on a decoding algorithm. The decoding algorithm can be selected as a maximum a posteriori (MAP) based decoding algorithm. In this regard, it should be understood that the processing loop module 120 is comprised of an inner decoder module 104, a depermutation module 108, an outer decoder module 108, and a permutation module 110.

As shown in FIG. 1, the inner decoder module 104 is coupled to the input buffer memory 102, the permutation module 110, and the depermutation module 106. The inner decoder module 104 is comprised of hardware and firmware configured to receive two (2) or more codeblock segments communicated, in parallel, from the input buffer memory 102. The inner decoder module 104 is also comprised of hardware and firmware configured to receive two (2) or more soft-decision bits communicated, sequentially, from the permutation module 110. The inner decoder module 104 is further comprised of hardware and firmware configured to process soft-decision bits contained in a codeblock segment received from the input buffer memory 102. Similarly, the inner decoder module 104 is further comprised of hardware and firmware configured to process soft-decision bits received from the permutation module 110. The inner decoder module 104 is comprised of hardware and firmware configured to communicate, in parallel, processed soft-decision bits to the depermutation module 106. The inner decoder module 104 will be described in greater detail below in relation to FIG. 2.

The depermutation module 106 is comprised of hardware and firmware configured to receive processed soft-decision bits communicated, in parallel, from the inner decoder module 104. The depermutation module 106 is also comprised of hardware and firmware configured to serially link two (2) or more soft-decision bits together to form a codeword segment. The depermutation module 106 is further comprised of hardware and firmware configured to sequentially forward codeword segments to two or more depermutation buffer memories (described below in relation to FIG. 3) in a single write operation.

As shown in FIG. 1, the depermutation module 106 is coupled to the outer decoder module 108. In this regard, it should be appreciated that the depermutation module 106 is comprised of hardware and firmware configured to retrieve codeword segments from the two or more depermutation buffer memories (described below in relation to FIG. 3). In this regard, it should be appreciated that the codeword segments are read from the depermutation buffer memories in an order different from an order in which the codeword segments are written to the depermutation buffer memories for storage. The depermutation module 106 is further comprised of hardware and firmware configured to extract soft-decision bits from codeword segments. The depermutation module 106 is comprised of hardware and firmware configured to sequentially forward the extracted soft-decision bits to the outer decoder module 108 for processing. The depermutation module 106 will be described in greater detail below in relation to FIG. 3.

The outer decoder module 108 is comprised of hardware and firmware configured to receive soft-decision bits communicated, sequentially, from the depermutation module 106. The outer decoder module 108 is also comprised of hardware and firmware configured to process soft-decision bits contained within codeword segments received from the depermutation module 108. The outer decoder module 108 is further comprised of hardware and firmware configured to communicate, in parallel, two (2) or more processed soft-decision bits to the permutation module 110 or the output buffer memory 112. The outer decoder module 108 will be described in greater detail below in relation to FIG. 4.

The permutation module 110 is comprised of hardware and firmware configured to receive all or a portion of processed soft-decision bits communicated, in parallel, from the outer decoder module 108. The permutation module 110 is also comprised of hardware and firmware configured to serially link two or more soft-decision bits together to form a codeword segment. The permutation module 110 is further comprised of hardware and firmware configured to sequentially forward codeword segments to two or more permutation buffer memories (described below in relation to FIG. 5) in a single write operation.

As shown in FIG. 1, the permutation module 110 is coupled to the inner decoder module 104. In this regard, it should be appreciated that the permutation module 110 is comprised of hardware and firmware configured to sequentially retrieve codeword segments from the two or more permutation buffer memories (described below in relation to FIG. 5). In this regard, it should be appreciated that codeword segments are read from the permutation buffer memories in an order different from an order in which the codeword segments are written to the permutation buffer memories for storage. The permutation module 110 is also comprised of hardware and firmware configured to extract soft-decision bits from codeword segments. The permutation module 110 is further comprised of hardware and firmware configured to sequentially forward the extracted soft-decision bits to the inner decoder module 104 for processing. The permutation module 110 will be described in greater detail below in relation to FIG. 5.

A person skilled in the art will appreciate that the SCCC decoder 100 is one architecture of a SCCC decoder. However, the invention is not limited in this regard and any other SCCC decoder architecture can be used without limitation.

Figure 2:
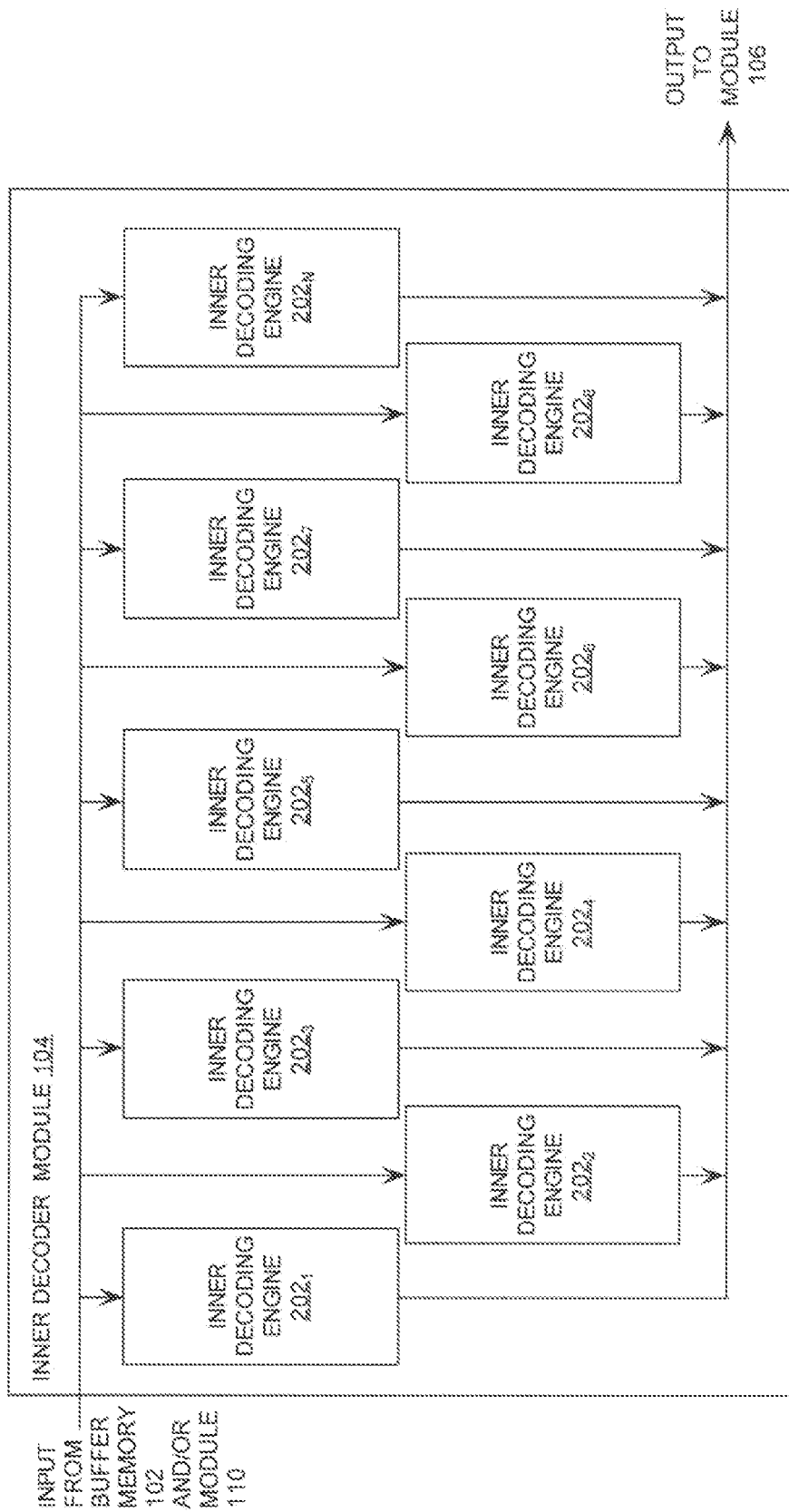
FIG. 2 is a detailed block diagram of an inner decoder module that is useful for understanding the invention.

Referring now to FIG. 2, there is provided a detailed block diagram of an inner decoder module 104 that is useful for understanding the invention. As shown in FIG. 2, the inner decoder module 104 is subdivided into 'N' inner decoding engines $202_1$-$202_N$. The inner decoding engines $202_1$-$202_N$ are configured to concurrently perform a decoding operation based on a decoding algorithm thereby providing an improved processing time feature to the inner decoder module 104. According to an embodiment of the invention, the inner decoder module 104 is a maximum a posteriori (MAP) based decoder. Accordingly, the inner decoding engines $202_1$-$202_N$ can each be configured with a MAP decoding algorithm. MAP based decoders are well known to persons skilled in the art. Thus, MAP based decoders will not be described in great detail herein. However, it should be appreciated that the present invention is not limited in this regard. It should also be appreciated that such a multi-inner decoding engine architecture provides an improved processing time feature to the inner decoder module 104. Specifically, the inner decoder module 104 can process more soft-decision bits in the same amount of time as a conventional inner decoder module.

The inner decoder module 104 can further include a device (not shown) configured to simultaneously retrieve 'N' codeblock segments from the input buffer memory 102. The device can also be configured to forward a particular codeblock segment of the 'N' codeblock segments to a certain inner decoding engine $202_1$-$202_N$. The device can further be configured to communicate, in parallel, 'N' codeblock segments to 'N' inner decoding engines $202_1$-$202_N$, respectively.

Figure 3:
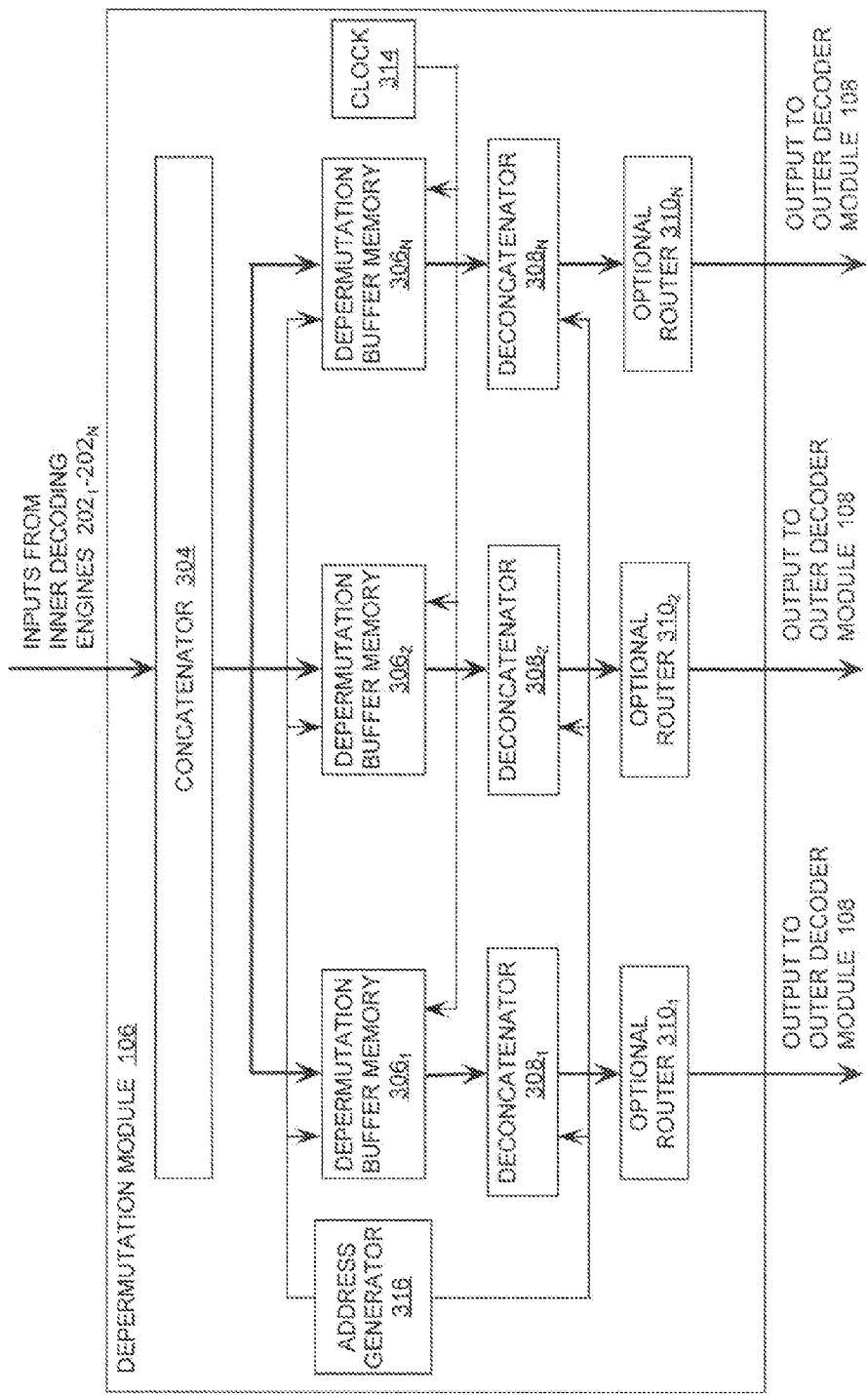
FIG. 3 is a detailed block diagram of a depermutation module that is useful for understanding the invention.

Referring now to FIG. 3, there is provided a detailed block diagram of a depermutation module 106 that is useful for understanding the invention. As shown in FIG. 3, the depermutation module 106 is comprised of a concatenator 304, depermutation buffer memories $306_1$-$306_N$, deconcatenators $308_1$-$308_N$, optional routers $310_1$-$310_N$, a clock 314, and an address generator 316. Each of these components is well known to a person skilled in the art. Thus, the listed components will not be described in great detail herein. However, a brief description of the listed components is provided below to assist a reader in understanding the present invention.

Referring again to FIG. 3, the concatenator 304 is comprised of hardware and firmware configured to receive soft-decision bits communicated, in parallel, from each inner decoding engine $202_1$-$202_N$ (described above in relation to FIG. 2). The concatenator 304 is also comprised of hardware and firmware configured to serially link soft-decision bits received from the inner decoding engines $202_1$-$202_N$ to form a codeword segment. The concatenator 304 is further comprised of hardware and firmware configured to sequentially forward codeword segments to the depermutation buffer memories $306_1$-$306_N$ in a single write operation. In this regard, it should be appreciated that the same codeword segments are written to each of the depermutation buffer memories $306_1$-$306_N$. The advantage of this is that a plurality of depermutation buffer memories $306_1$-$306_N$ can simultaneously serve a set of outer decoding engines (described below in relation to FIG. 4). Consequently, a bottleneck issue is resolved.

The deconcatenators $308_1$-$308_N$ are comprised of hardware and firmware configured to sequentially retrieve codeword segments from the depermutation buffer memories $306_1$-$306_N$, respectively. However, it should be appreciated that the codeword segments are read from the depermutation buffer memories $306_1$-$306_N$ in an order different from an order in which the codeword segments are written the depermutation buffer memories $306_1$-$306_N$ for storage. Each deconcatenator $308_1$-$308_N$ is also comprised of hardware and firmware configured to break a codeword segment into a plurality of soft-decision bits, extract a particular soft-decision bit from the plurality of soft-decision bits, and forward the extracted soft-decision bit to an optional router $310_1$-$310_N$. The optional routers $310_1$-$310_N$ are comprised of hardware and firmware configured to sequentially communicate soft-decision bits to an outer decoder module 108 (described above in relation to FIG. 1 and below in relation to FIG. 4).

Notably, the depermutation module 106 architecture shown in FIG. 3 solves an information bit bottleneck or congestion characteristic occurring at the depermutation buffer memory. In this regard, it should be appreciated that a non-sequential retrieval of soft-decision bits from a single depermutation buffer memory, as well as a requirement to simultaneously serve 'N' inner/outer decoding engines, causes the information bit bottleneck at the depermutation buffer memory. The write method enabled by the depermutation module 106 architecture eliminates a write access bottleneck, in this regard, it should be appreciated that the write access bottleneck is resolved by storing the soft-decision bits generated simultaneously by the inner decoding engines $202_1$-$202_N$ as a single codeword segment. Similarly, the read method enabled by this depermutation module 106 architecture eliminates a read access bottleneck. In this regard, it should be appreciated that the read access bottleneck is resolved by having multiple redundant depermutation buffer memories $306_1$-$308_N$ serve 'N' outer decoding engines (described below in relation to FIG. 4).

A person skilled in the art will appreciate that the depermutation module 106 is one architecture of a depermutation module. However, the invention is not limited in this regard and any other depermutation module architecture can be used without limitation.

Figure 4:
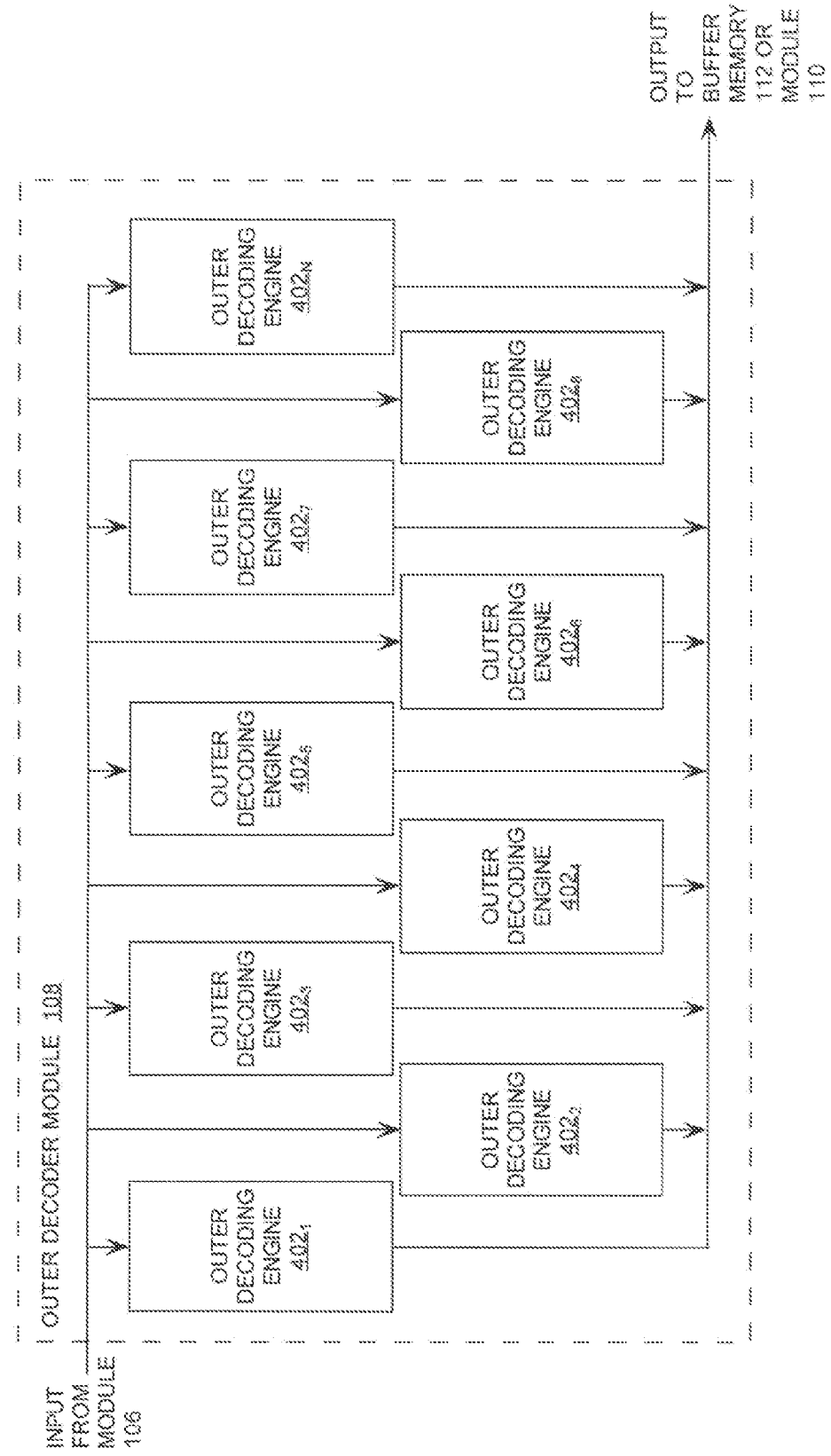
FIG. 4 is a detailed block diagram of an outer decoder module that is useful for understanding the invention.

Referring now to FIG. 4, there is provided a detailed block diagram of an outer decoder module 108 that is useful for understanding the invention. As shown in FIG. 4, the outer decoder module 108 is subdivided into 'N' outer decoding engines $402_1$-$402_N$. The outer decoding engines $402_1$-$402_N$ are configured to concurrently perform a decoding operation based on a decoding algorithm thereby providing an improved processing time feature to the outer decoder module 108. According to an embodiment of the invention, the outer decoder module 108 is a maximum a posteriori (MAP) based decoder. Accordingly, the outer decoding engines $402_1$-$402_N$ can be configured with a MAP type decoding algorithm. MAP based decoders are well known to persons skilled in the art. Thus, MAP based decoders will not be described in great detail herein. However, it should be appreciated that the present invention is not limited in this regard. It should also be appreciated that such a multi-outer decoding engine architecture provides an improved processing time feature to the outer decoder module 108. Specifically, the outer decoder module 108 can process more soft-decision bits in the same amount of time as a conventional outer decoder module.

The outer decoder module 108 can include a device (not shown) configured to sequentially communicate 'N' codeword segments to an output buffer memory 112 (described above in relation to FIG. 1) for storage. The outer decoder module 108 can also include a device configured to concatenate 'N' codeword segments to form a single codeword. The outer decoder module 108 can also include a device configured to communicate a codeword to an output buffer memory 112 for storage in a memory location having a single address.

Figure 5:
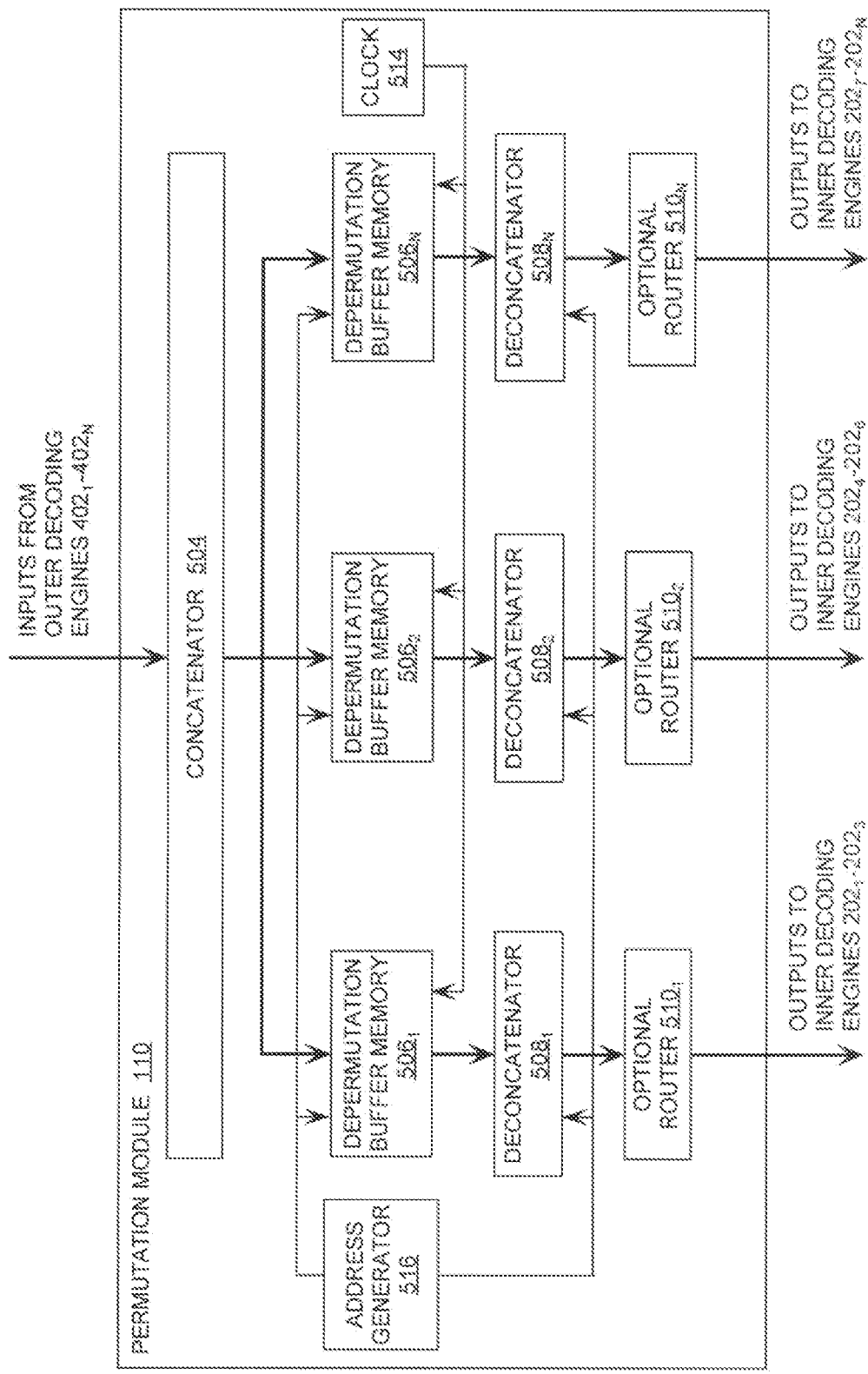
FIG. 5 is a detailed block diagram of a permutation module that is useful for understanding the invention.

Referring now to FIG. 5, there is provided a detailed block diagram of a permutation module 110 that is useful for understanding the invention. As shown in FIG. 5, the permutation module 110 is comprised of a concatenator 504, permutation buffer memories $506_1$-$506_N$, deconcatenators $508_1$-$508_N$, optional routers $510_1$-$510_N$, a clock 514, and an address generator 516. Each of these components is well known to a person skilled in the art. Thus, the listed components will not be described in great detail herein. However, a brief description of the listed components is provided below to assist a reader in understanding the present invention.

Referring again to FIG. 5, the concatenator 504 is comprised of hardware and firmware configured to receive soft-decision bits communicated, in parallel, from each outer decoding engine $402_1$-$402_N$ (described above in relation to FIG. 4). The concatenator 504 is also comprised of hardware and firmware configured to serially link soft-decision bits received from the outer decoding engines $402_1$-$402_N$ to form a codeword segment. The concatenator 504 is further comprised of hardware and firmware configured to sequentially forward codeword segments to the permutation buffer memories $506_1$-$506_N$ in a single write operation. In this regard, it should be appreciated that the same codeword segments are written to each of the permutation buffer memories $506_1$-$506_N$. The advantage of this is that a plurality of permutation buffer memories $506_1$-$506_N$ can simultaneously serve a set of inner decoding engines $202_1$-$202_N$ (described below in relation to FIG. 2). Consequently, a bottleneck issue is resolved.

The deconcatenators $508_1$-$508_N$ are comprised of hardware and firmware configured to sequentially retrieve codeword segments from the permutation buffer memories $506_1$-$506_N$, respectively. However, it should be appreciated that the codeword segments are read from the permutation buffer memories $506_1$-$506_N$ in an order different from an order in which the codeword segments are written the permutation buffer memories $506_1$-$506_N$ for storage. Each deconcatenator $508_1$-$508_N$ is also comprised of hardware and firmware configured to break a codeword segment into a plurality of soft-decision bits, extract a particular soft-decision bit from the plurality of soft-decision bits, and forward the extracted soft-decision bit to an optional router $510_1$-$510_N$. The optional routers $510_1$-$510_N$ are comprised of hardware and firmware configured to sequentially communicate soft-decision bits to inner decoding engines $202_1$-$202_N$ (described above in relation to FIG. 2).

Notably, the permutation module 110 architecture shown in FIG. 5 solves an information bit bottleneck or congestion characteristic occurring at a permutation buffer memory. In this regard, it should be appreciated that a non-sequential retrieval of soft-decision bits from a single permutation buffer memory, as well as a requirement to simultaneously serve 'N' inner/outer decoding engines, causes the information bit bottleneck at the permutation buffer memory. The write method enabled by the permutation module 110 architecture eliminates a write access bottleneck. In this regard, it should be appreciated that the write access bottleneck is resolved by storing the soft-decision bits generated simultaneously by the outer decoding engines $402_1$-$402_N$ (described above in relation to FIG. 4) as a single codeword segment. Similarly, the read method enabled by this permutation module 110 architecture eliminates a read access bottleneck. In this regard, it should be appreciated that the read access bottleneck is resolved by having multiple redundant permutation buffer memories $506_1$-$506_N$ serve 'N' inner decoding engines $202_1$-$202_N$ (described above in relation to FIG. 2).

A person skilled in the art will appreciate that the permutation module 110 is one architecture of a permutation module. However, the invention is not limited in this regard and any other permutation module architecture can be used without limitation.

Figure 6A:
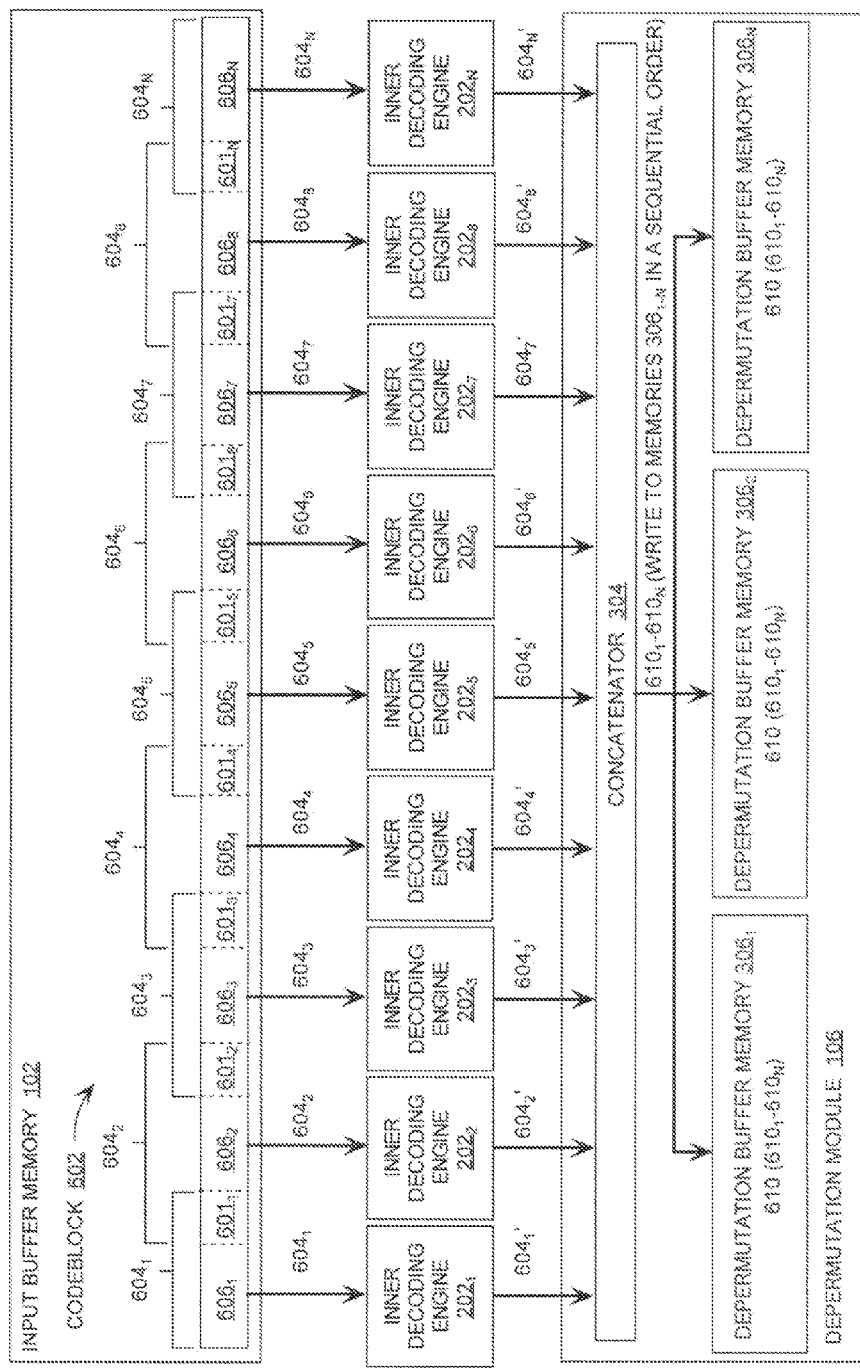
FIGS. 6A-6C collectively illustrate an operation of an SCCC decoder that is useful for understanding the invention.

The operation of the SCCC decoder 100 will now be described in detail with regards to FIG. 6A through FIG. 6C. As shown in FIG. 6A, a codeblock 602 is stored in an input buffer memory 102. If should be understood that the codeblock 602 is comprised of soft-decision bits (for example, four (4) thousand soft-decision bits) encoded using a forward error correction (FEC) encoding technique based on a series of convolution codes, separated by a permutation step.

Referring again to FIG. 6A, the codeblock 602 is comprised of 'N' codeblock segments $604_1$-$604_N$. Each codeblock segment $604_1$-$604_N$ is comprised of one (1) or more overlap bit portions $601_1$-$601_N$ and a non-overlap bit portion $606_1$-$606_N$. For example, the codeblock segment $604_2$ is comprised of a front-end overlap bit portion $601_1$, a non-overlap bit portion $606_2$, and a back-end overlap bit portion $601_2$. It should be appreciated that each overlap bit portion $601_1$-$601_N$ is comprised of a number of soft-decision bits in accordance with a particular decoding scheme implemented in an SCCC decoder 100, If should also be appreciated that each overlap bit portion $601_1$-$601_N$ includes soft-decision bits contained within two (2) or more codeblock segments $604_1$-$604_N$. It should further be appreciated that each non-overlap bit portion $606_1$-$606_N$ includes soft-decision bits contained within a single codeblock segment $604_1$-$604_N$.

As shown in FIG. 6A, each inner decoding engine $202_1$-$202_N$ retrieves, in parallel a respective codeblock segment $604_1$-$604_N$ from the input buffer memory 102. For example, the inner decoding engine $202_1$ retrieves a codeblock segment $604_1$ from an input buffer memory 102 location having a first address. Similarly, the inner decoding engine $202_2$ retrieves a codeblock segment $604_2$ from an input buffer memory 102 location having a second address. Likewise, each inner decoding engine $202_3$-$202_N$ retrieves a respective codeblock segment $604_3$-$604_N$ from input buffer memory 102 locations having different addresses.

However, it should be understood that each inner decoding engine $202_1$-$202_N$ retrieves a codeblock segment $604_1$-$604_N$ in a clock cycle by clock cycle, bit(s) by bit(s) manner. For example, the inner decoding engine $202_2$ receives a first soft-decision bit or a first set of soft-decision bits included in the front-end overlap bit portion $601_1$ during a first clock cycle. Thereafter, the inner decoding engine $202_2$ receives a second soft-decision bit or a second set of soft-decision bits included in the front end overlap bit portion $601_1$ during a second clock cycle. Subsequently, the inner decoding engine $202_2$ receives a third soft-decision bit or a third set of soft-decision bits included in the non-overlap bit portion $606_2$ during a third clock cycle, and so on.

Upon receipt of a first soft-decision bit or a first set of soft-decision bits, each inner decoding engine $202_1$-$202_N$ begins performing a decoding operation based on an inner convolutional code. The decoding operation is performed to partially decode soft-decision bits contained within a respective codeblock segment $604_1$-$604_N$. According to an embodiment of the invention, each inner decoding engine $202_1$-$202_N$ utilizes a maximum a posteriori (MAP) decoding algorithm designed in accordance with the inner convolutional code. As will be understood by a person skilled in the art, there are many MAP based decoding algorithms that can be implemented within an inner decoding engine $202_1$-$202_N$. Any such MAP based decoding algorithm can be used without limitation, provided that it corresponds to a particular encoding scheme used for encoding information bits contained within the codeblock 602.

Referring again to FIG. 6A, each inner decoding engine $202_1$-$202_N$ concurrently processes soft-decision bits contained within a respective codeblock segment $604_1$-$604_N$. In this regard, it should be appreciated that the inner decoding engines $202_1$-$202_N$ do not produce outputs corresponding to all soft-decision bits contained within an overlap bit portion $601_1$-$601_N$. In effect, the inner decoding engines $202_1$-$202_N$ avoid an error rate increase that would otherwise occur with codeblock segmentation. For example, the inner decoding engine $202_2$ does not produce an output corresponding to a first sixteen (16) soft-decision bits of the front-end overlap bit portion $601_1$ and a last sixteen (16) soft-decision bits of the back-end overlap bit portion $601_2$. As such, the inner decoding engine $202_2$ outputs a processed codeblock segment $604_2$' that is absent of the first sixteen (16) soft-decision bits of the front-end overlap bit portion $601_1$ and the last sixteen (16) soft-decision bits of the back-end overlap bit portion $601_2$. Still, the invention is not limited in this regard.

After concurrently processing soft-decision bits contained within a respective codeblock segment $604_1$-$604_N$, the inner decoding engines $202_1$-$202_N$ communicate, in parallel, the processed codeblock segments $604_1$'-$604_N$' to a concatenator 304 of the depermutation module 106. In this regard, it should be appreciated that the processed codeblock segments $604_1$'-$604_N$' are communicated to the concatenator 304 in a clock cycle by clock cycle, sequential bit by bit manner. For example, a first soft-decision bit of each processed codeblock segment $604_1$'-$604_N$' is communicated, in parallel, to the concatenator 304 in a first clock cycle. A second soft-decision bit of each processed codeblock segment $604_1$'-$604_N$' is communicated, in parallel to the concatenator 304 in a second clock cycle, and so on.

Upon receipt of a first soft-decision bit from each inner decoding engine $202_1$-$202_N$, the concatenator 304 serially links the same together to form a first codeword segment comprised of 'N' decoded soft-decision bits. Thereafter, the concatenator 304 forwards the first codeword segment $610_1$ to the depermutation buffer memories $306_1$-$306_N$ for storage. Similarly, the concatenator 304 serially links a set of second soft-decision bits received from the inner decoding engines $202_1$-$202_N$ to form a second codeword segment $610_2$ comprised of 'N' decoded soft-decision bits. Once the second codeword segment $610_2$ is formed, the concatenator 304 towards the second codeword segment $610_2$ to the depermutation buffer memories $306_1$-$306_N$ for storage. The concatenator 304 repeats this process until all soft-decision bits contained In each codeblock segment $604_1$'-$604_N$' have been communicated to the concatenator 304 and forwarded to the depermutation buffer memories $306_1$-$306_N$ for storage as codeword segments $610_3$-$610_N$. As shown in FIG. 6A, the codeword segments $610_1$-$610_N$ are stored in the depermutation buffer memories $306_1$-$306_N$ as a single codeword 610.

Figure 6B:
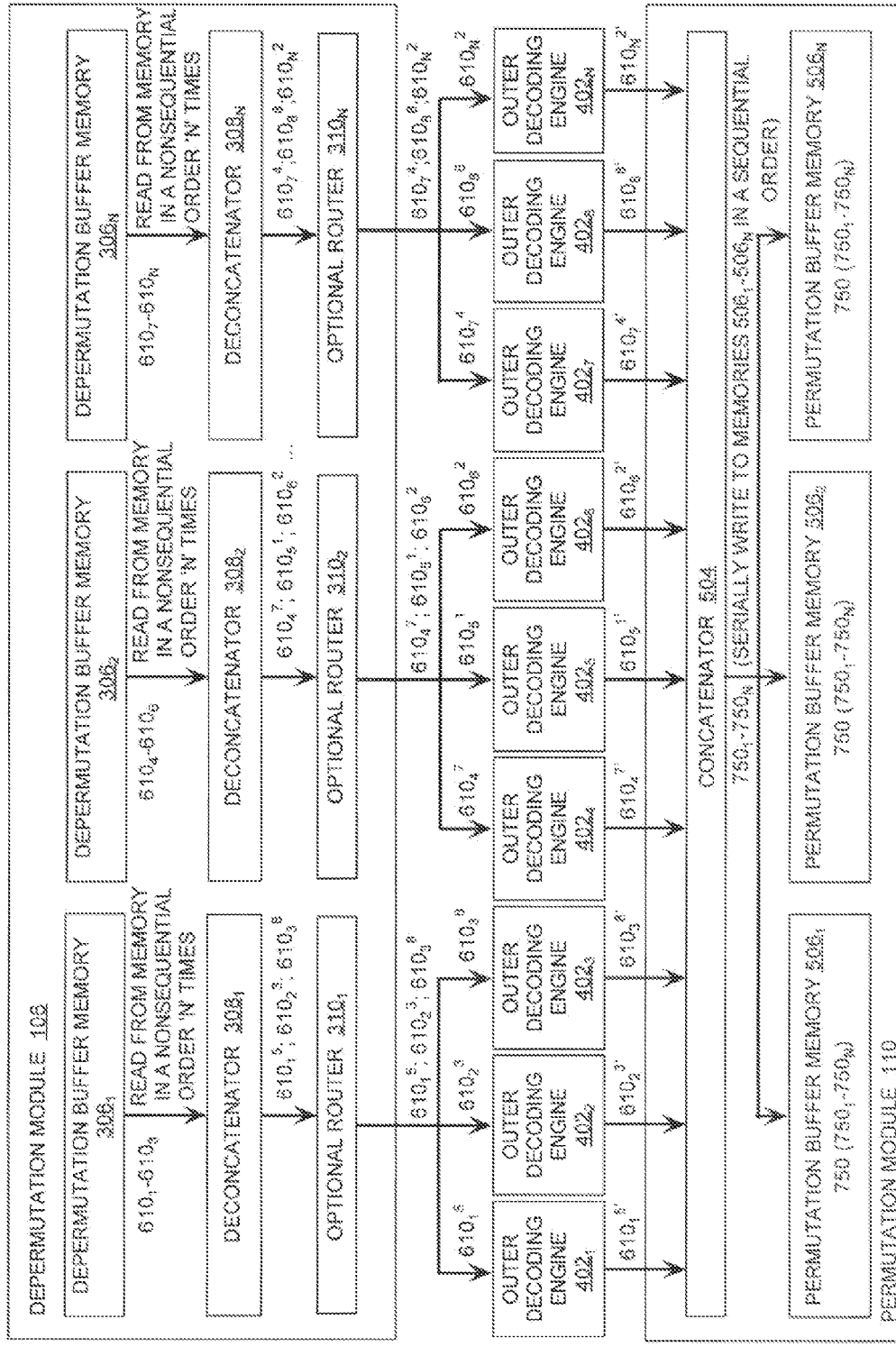

As shown in FIG. 6B, the depermutation module 106 is coupled to each outer decoding engine $402_1$-$402_N$. As such, the deconcatenator $308_1$ sequentially retrieves codeword segments $610_1$-$610_3$ from a depermutation buffer memory $306_1$. Similarly, the deconcatenator $308_2$ sequentially retrieves codeword segments $610_4$-$610_6$ from a depermutation buffer memory $306_2$. Likewise, the deconcatenator $308_N$ sequentially retrieves codeword segments $610_7$-$610_N$ from a depermutation buffer memory $306_N$. In this regard, it should also be understood that the deconcatenators $308_1$-$308_N$ retrieve a single codeword segment per clock cycle. For example, the deconcatenator $308_1$ retrieves a codeword segment $610_1$ during a first clock cycle. The deconcatenator $308_1$ retrieves a codeword segment $610_2$ during a second clock cycle. The deconcatenator $308_1$ retrieves a codeword segment $610_3$ during a third clock cycle, and so on.

It should also be understood that the codeword segments $610_1$-$610_N$ are read from the depermutation buffer memories $306_1$-$306_N$ in an order different from an order in which the codeword segments $610_1$-$610_N$ are written to the depermutation buffer memories $306_1$-$306_N$ for storage. As will be understood by a person skilled in the art, the order in which the codeword segments $610_1$-$610_N$ are read from the depermutation buffer memories $306_1$-$306_N$ is determined by the address generator 316 (described above in relation to FIG. 3) using data contained in a depermutation fable stored in a memory of the SCCC decoder 100. For example, the address generator 316 retrieves data from the depermutation table and performs processing on the data to generate a plurality of non-sequentially ordered depermutation buffer memory $306_1$-$306_N$ location addresses.

It should further be understood that each codeword segment $610_1$-$610_N$ is retrieved from a respective depermutation buffer memory $306_1$-$306_N$ a plurality of times so that each soft-decision bit contained in the codeword segments $610_1$-$610_N$ is processed by a respective outer decoding engine $402_1$-$402_N$. For example, if a codeword segment $610_1$-$610_N$ includes 'N' decoded soft-decision bits, then the codeword segment $610_1$-$610_N$ is retrieved from the respective depermutation buffer memory $306_1$-$306_N$ 'N' times.

Once a deconcatenator $308_1$-$308_N$ receives a codeword segment $610_1$-$610_N$, the deconcatenator $308_1$-$308_N$ performs processing on the codeword segment $610_1$-$610_N$ to break the codeword segment $610_1$-$610_N$ into a plurality of soft-decision bits and extract a particular soft-decision bit therefrom. After processing a received codeword segment $610_1$-$610_N$, the deconcatenator $308_1$-$308_N$ forwards the extracted soft-decision bit to a respective optional router $310_1$-$310_N$. In turn, the optional router $310_1$-$310_N$ forwards the extracted soft-decision bit $610_1^5$, $610_2^3$, $610_3^8$, $610_4^7$, $610_5^1$, $610_6^2$, $610_7^4$, $610_8^8$, $610_N^2$ to a particular outer decoding engine $402_1$-$402_N$. In this regard, it should be understood that the outer decoding engines $402_1$-$402_N$ sequentially receive soft-decision bits from the optional routers $310_1$-$310_N$, respectively. According to an embodiment of the invention, the optional routers $310_1$-$310_N$ communicate a single soft-decision bit to an outer decoding engine $402_1$-$402_N$ per clock cycle. For example, the optional router $310_1$ forwards a fifth soft-decision $610_1^5$ of a codeword segment $610_1$ to an outer decoding engine $402_1$ during a first clock cycle. Similarly, the optional router $310_1$ forwards a third soft-decision bit $610_2^3$ of a codeword segment $610_2$ to an outer decoding engine $402_2$ during a second clock cycle. Likewise, the optional router $310_1$ forwards an eighth soft-decision bit $610_3^8$ of a codeword segment $610_3$ to an outer decoding engine $402_3$ during a third clock cycle, and so on.

Upon receipt of a soft-decision bit, an outer decoding engine $402_1$-$402_N$ begins performing a decoding operation based on a decoding algorithm. For example, a MAP type decoding algorithm can be used for this purpose. This decoding operation is performed for processing a soft-decision bit $610_1^5$, $610_2^3$, $610_3^8$, $610_4^7$, $610_5^1$, $610_5^2$, $610_7^4$, $610_8^8$, $610_N^2$. In this regard, if should be appreciated that the outer decoding engines $402_1$-$402_N$ are configured to concurrently process respective soft-decision bits $610_1^5$, $610_2^3$, $610_3^8$, $610_4^7$, $610_5^1$, $610_5^2$, $610_7^4$, $610_8^8$, $610_N^2$. After processing the soft-decision bits $610_1^5$, $610_2^3$, $610_3^8$, $610_4^7$, $610_5^1$, $610_6^2$, $610_7^4$, $610_8^8$, $610_N^2$, the outer decoding engines $402_1$-$402_N$ communicate, in parallel, the processed soft-decision bits $610_1^{5'}$, $610_2^{3'}$, $610_3^{8'}$, $610_4^{7'}$, $610_5^{1'}$, $610_6^{2'}$, $610_7^{4'}$, $610_8^{8'}$, $610_N^{2'}$ to a concatenator 504 of a permutation module 110. It should be appreciated that the outer decoding engines $402_1$-$402_N$ repeat this process until all soft-decision bits contained in a codeword 610 have been processed by a respective outer decoding engine $402_1$-$402_N$ and forwarded to the concatenator 504.

Upon receipt of a processed soft-decision bit $610_1^{5'}$, $610_2^{3'}$, $610_3^{8'}$, $610_4^{7'}$, $610_5^{1'}$, $610_6^{2'}$, $610_7^{4'}$, $610_8^{8'}$, $610_N^{2'}$ from each outer decoding engine $402_1$-$402_N$, the concatenator 504 serially links the same together to form a first codeword segment $750_1$. Thereafter, the concatenator 504 forwards the first codeword segment $750_1$ to the permutation buffer memories $506_1$-$506_N$ for storage. The concatenator 504 repeats this process until all the soft-decision bits contained in each codeword segment $610_1$-$610_N$ have been processed by the outer decoding engines $402_1$-$402_N$, communicated to the concatenator 504, and forwarded to the permutation buffer memories $506_1$-$506_N$ for storage as codeword segments $750_3$-$750_N$. As shown in FIG. 6B, the codeword segments $750_1$-$750_N$ are stored in the permutation buffer memories $506_1$-$506_N$ as a single codeword 750.

Figure 6C:
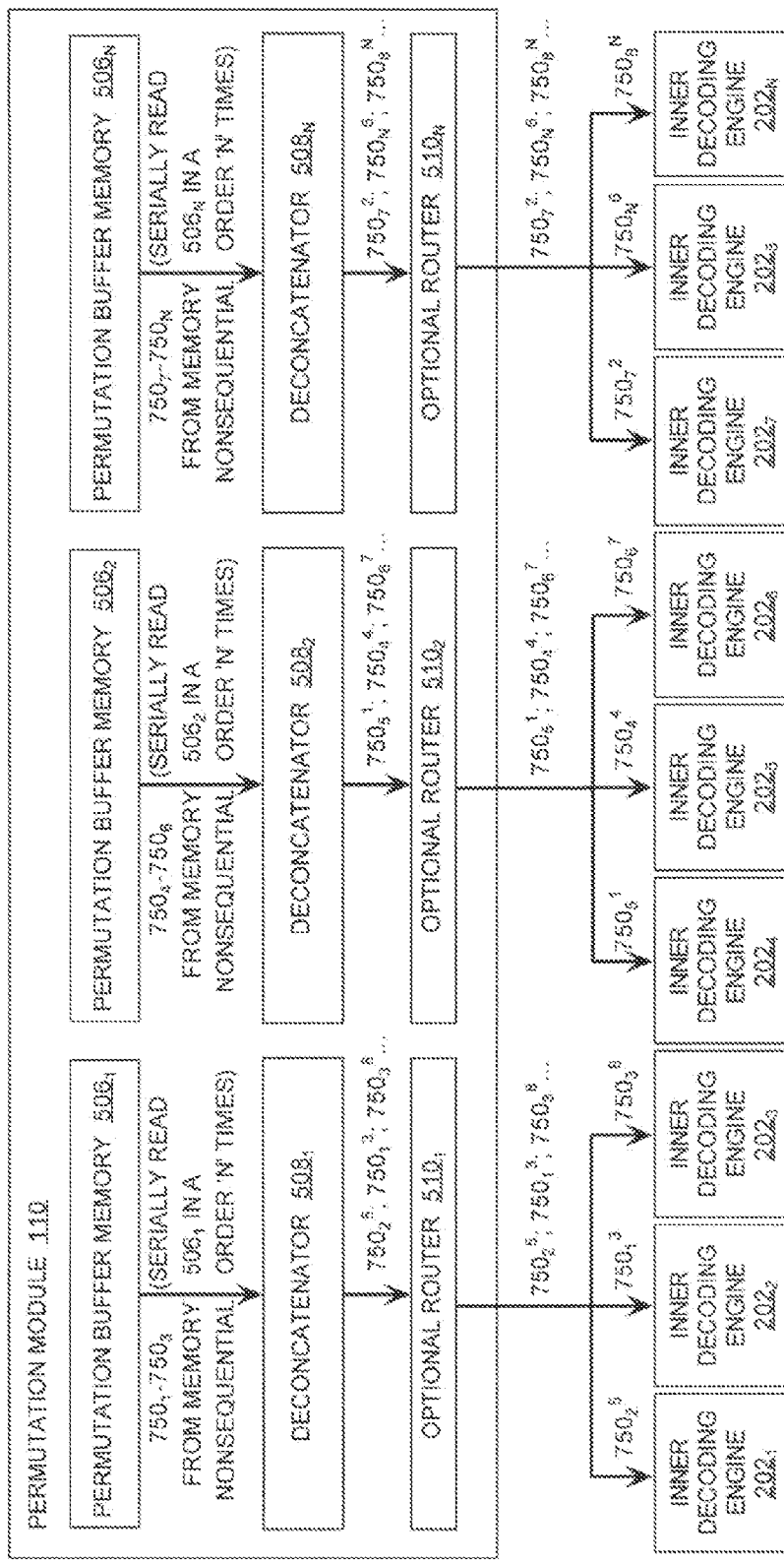
Figure 7B:
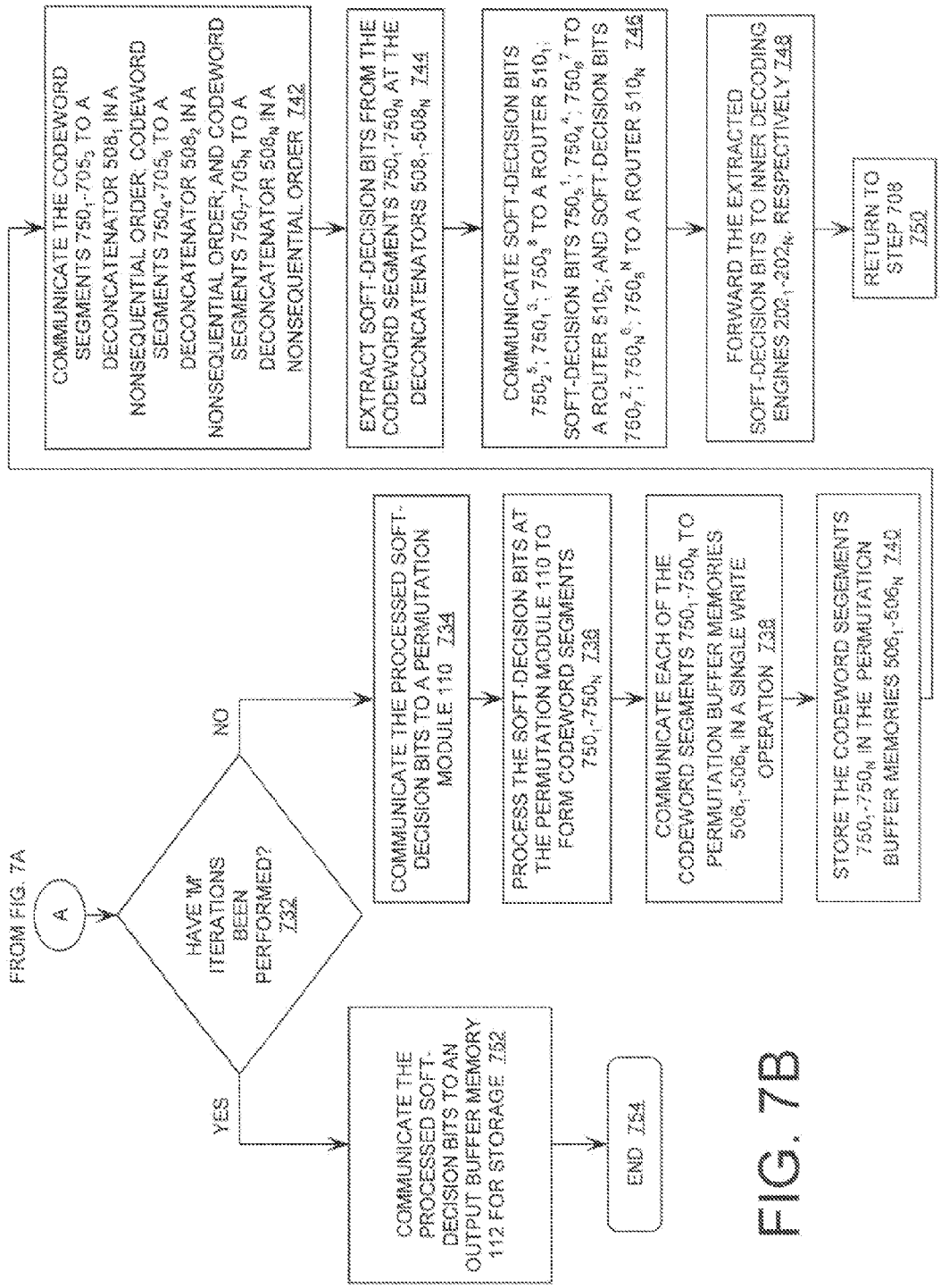

As shown in FIG. 6C, a permutation module 110 is coupled to each inner decoding engine $202_1$-$202_N$. As such, it should be understood that deconcatenators $508_1$-$508_N$ sequentially retrieve codeword segments $750_1$-$750_N$ from permutation buffer memories $506_1$-$506_N$, respectively, in this regard, it should also be understood that the deconcatenators $508_1$-$508_N$ retrieve a single codeword segment per clock cycle. For example, the deconcatenator $508_1$ retrieves a permuted codeword $750_2$ during a first clock cycle. The deconcatenator $508_1$ retrieves a permuted codeword $750_1$ during a second clock cycle, and so on.

It should be understood that the codeword segments $750_1$-$750_N$ are retrieved from the permutation buffer memories $506_1$-$506_N$ in an order different from an order in which the codeword segments $750_1$-$750_N$ were written to the permutation buffer memories $506_1$-$506_N$ for storage. As will be understood by a person skilled in the art, the order in which the codeword segments $750_1$-$750_N$ are read from the permutation buffer memories $506_1$-$506_N$ is determined by the address generator 516 (described above in relation to FIG. 5) using data contained in a permutation fable stored in a memory of the SCCC decoder 100. For example, the address generator 516 retrieves data from the permutation table and performs processing on the data to generate a plurality of non-sequentially ordered depermutation buffer memory $506_1$-$506_N$ location addresses.

It should further be understood that each codeword segment $750_1$-$750_N$ is retrieved from the permutation buffer memories $506_1$-$506_N$ a plurality of times so that each soft-decision bit contained in the codeword segments $750_1$-$750_N$ is processed by a respective inner decoding engine $202_1$-$202_N$. For example, if a codeword segment $750_1$-$750_N$ includes 'N' decoded soft-decision bits, then the codeword segment $750_1$-$750_N$ is retrieved from the respective permutation buffer memory $506_1$-$506_N$ 'N' times.

Once a deconcatenator $508_1$-$508_N$ receives a codeword segment $750_1$-$750_N$, the deconcatenator $508_1$-$508_N$ performs processing on the codeword segment $750_1$-$750_N$ to break the codeword segment $750_1$-$750_N$ into a plurality of soft-decision bits and extract a particular soft-decision bit therefrom. After processing the codeword segment $750_1$-$750_N$, the deconcatenator $508_1$-$508_N$ forwards the extracted soft-decision bit to a respective optional router $510_1$-$510_N$. In turn, the optional router $510_1$-$510_N$ forwards the extracted soft-decision bit $750_1{}^3, 750_2{}^5, 750_3{}^8, 750_4{}^4, 750_5{}^1, 750_6{}^7, 750_7{}^2, 750_8{}^N, 750_N{}^6$ to a particular inner decoding engine $202_1$-$202_N$. In this regard, it should be appreciated that the inner decoding engines $202_1$-$202_N$ sequentially receive soft-decision bits from the optional routers $510_1$-$510_N$. According to an embodiment of the invention, the optional routers $510_1$-$510_N$ communicate a single soft-decision bit to an inner decoding engine $202_1$-$202_N$ per clock cycle. For example, the optional router $510_1$ forwards a fifth soft-decision bit of a codeword segment $750_2$ to an inner decoding engine $202_1$ during a fourth clock cycle. Similarly, the optional router $510_1$ forwards a third soft-decision bit of a codeword $750_1$ to an inner decoding engine $202_2$ during a sixth clock cycle, and so on.

A person skilled in the art will appreciate that the schematics of FIGS. 6A-6C collectively illustrate one embodiment of an operation of the SCCC decoder 100. However, the invention is not limited in this regard and any equivalent embodiments are intended to be within the scope of the present invention.

Referring now to FIG. 7, there is provided a flow diagram of a method 700 for serial concatenated convolutional decoding that is useful for understanding the invention. The method 700 begins at step 702 and continues with step 704. In step 704, a codeblock 602 is received at an input buffer memory 102. In step 706, the codeblock 602 is broken into 'N' codeblock segments $604_1$-$604_N$. The 'N' codeblock segments $604_1$-$604_N$ each have overlap bits $601_1$-$601_N$ and non-overlap bits $606_1$-$606_N$. After step 706, the method 700 continues with step 708 where each codeblock segment $604_1$-$604_N$ is communicated, in parallel, to a respective inner decoding engine $202_1$-$202_N$ in a clock cycle by clock cycle, sequential bit(s) by bit(s) manner. Upon receipt of all or a portion of a codeblock segment $604_1$-$604_N$, the inner decoding engines $202_1$-$202_N$ begin performing a decoding operation based on an inner convolutional code and concurrently process received soft-decision bits. In this regard, it should be appreciated that the inner convolutional code is designed in accordance with a maximum a-posteriori (MAP) based decoding algorithm. After step 710, step 712 is performed where the inner decoding engines $202_1$-$202_N$ communicate, in parallel, the processed codeblock segments $604_1{}'$-$604_N{}'$ to a depermutation module 106 in a clock cycle by clock cycle, bit by bit manner.

In step 714, the depermutation module 106 processes the codeblock segments $604_1{}'$-$604_N{}'$ to form codeword segments $610_1$-$610_N$. Thereafter, step 716 is performed where each of the codeword segments $610_1$-$610_N$ is communicated to the depermutation buffer memories $306_1$-$306_N$ in a single write operation. After step 716, the method 700 continues with step 718. In step 718, the codeword segments $610_1$-$610_N$ are stored in the depermutation buffer memories $306_1$-$306_N$. Subsequently, step 720 is performed where codeword segments $610_1$-$610_N$ are communicated to a deconcatenator $308_1$ in a non-sequential order. Similarly, the codeword segments $610_4$-$610_6$ are communicated to a deconcatenator $308_2$ in a non-sequential order. Likewise, the codeword segments $610_7$-$610_n$ are communicated to a deconcatenator $308_N$ in a non-sequential order. In step 722, the deconcatenators $308_1$-$308_N$ extract soft-decision bits $610_1{}^5, 610_2{}^3, 610_3{}^8, 610_4{}^7, 610_5{}^1, 610_6{}^2, 610_7{}^4, 610_8{}^8, 610_N{}^2$ from the codeword segments $610_7$-$610_n$. After step 722, step 724 is performed where the deconcatenator $308_1$ communicates extracted soft-decision bits $610_1{}^5, 610_2{}^3, 610_3{}^8$ to an optional router $310_1$. Similarly, the deconcatenator $308_2$ communicates extracted soft-decision bits $610_4{}^7, 610_5{}^1, 610_6{}^2$ to an optional router $310_2$. Likewise, the deconcatenator $308_N$ communicates extracted soft-decision bits $610_7{}^4, 610_8{}^8, 610_N{}^2$ to an optional router $310_N$.

In step 726, the optional routers $310_1$-$310_N$ forward the extracted soft-decision bits $610_1{}^5, 610_2{}^3, 610_3{}^8, 610_4{}^7, 610_5{}^1, 610_6{}^2, 610_7{}^4, 610_8{}^8, 610_N{}^2$ to outer decoding engines $402_1$-$402_N$, respectively. Upon receipt of an extract soft-decision bit, the outer decoding engines $402_1$-$402_N$ begin performing a decoding operation based on an outer convolutional code and process received soft-decision bits, in this regard, it should be appreciated that each outer decoding engines $402_1$-$402_N$ utilizes a maximum a posteriori (MAP) decoding algorithm designed in accordance with the outer convolutional code. Subsequently, the method 700 continues with a decision step 732 of FIG. 7B.

If "M" iterations have not been performed (732:NO), then step 734 is performed where the processed soft-decision bits are communicated, in parallel, to a permutation module 110. After step 734, step 736 is performed where the permutation module 110 processes the soft-decision bits to form codeword segments $750_1$-$750_N$. Thereafter, step 738 is performed where each codeword segment $750_1$-$750_N$ is communicated to permutation buffer memories $506_1$-$506_N$ in a single write operation. Subsequently, step 740 is performed where the codeword segments $750_1$-$750_N$ are stored in the permutation buffer memories $506_1$-$506_N$. In step 742, the codewords $750_1$-$750_3$ are communicated to the deconcatenator $508_1$ in a non-sequential order. Similarly, the codewords $750_4$-$750_6$ are communicated to the deconcatenator $508_2$ in a non-sequential order. Likewise, the codewords $750_7$-$750_N$ are communicated to the deconcatenator $508_N$ in a non-sequential order.

In step 744, the deconcatenators $508_1$-$508_N$ extract soft-decision bits from the codeword segments $750_1$-$750_N$. Thereafter, step 746 is performed where the deconcatenator $508_1$ communicates extracted soft-decision bits $750_2{}^5, 750_1{}^3, 750_3{}^8$ to an optional router $610_1$. Similarly, the deconcatenator $508_2$ communicates extracted soft-decision bits $750_5{}^1, 750_4{}^4, 750_6{}^7$ to an optional router $510_2$. Likewise, the deconcatenator $508_N$ communicates extracted soft-decision bits $750_7{}^2, 750_N{}^5, 750_8{}^N$ to an optional router $510_N$. In step 748, the optional routers $510_1$-$510_N$ forward the extracted soft-decision bits $750_2{}^6, 750_1{}^3, 750_3{}^8, 750_5{}^1, 750_4{}^4, 750_6{}^7, 750_7{}^2, 750_N{}^6, 750_8{}^N$ to the inner decoding engines $202_1$-$202_N$, respectively. After step 748, step 750 is performed where the method 700 returns to step 708.

If "M" iterations have been performed (732: YES), then step 752 is performed where the processed soft-decision bits are communicated to an output buffer memory 112 for storage. Thereafter, step 754 is performed where the method 700 ends.

A person skilled in the art will appreciate that the method 700 is one embodiment of a method for serial concatenated convolutional decoding. However, the invention is not limited in this regard and any other method for serial concatenated convolutional decoding can be used without limitation, provided that it is fast and area efficient.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:

1. A method for serial concatenated convolutional decoding, comprising:
   receiving a codeblock at an input buffer memory of a serial concatenated convolutional code decoder;
   separating said codeblock into a plurality of codeblock segments;
   concurrently communicating respective soft-decision bits from each of said codeblock segments to a respective one of a plurality of inner decoding engines;
   concurrently processing in said plurality of inner decoding engines the respective soft-decision bits associated with each of said plurality of codeblock segments to generate at least one soft-decision bit from each of the plurality of inner decoding engines;
   concatenating a set of said soft-decision bits generated by said plurality of inner decoding engines to form a codeword segment; and
   concurrently writing said codeword segment to a plurality of depermutation buffer memories.

2. The method according to claim 1, further comprising:
   repeating said processing, concatenating, and writing steps to respectively generate and store a plurality of said codeword segments so that said plurality of codeword segments is duplicated in each of said plurality of depermutation buffer memories.

3. The method according to claim 2, further comprising depermuting said codeword segments and extracting soft-decision bits from said codeword segments for a plurality of outer decoding engines.

4. The method according to claim 3, wherein said depermuting step further comprises a plurality of memory read accesses, and said memory read accesses are distributed among said plurality of depermutation buffer memories.

5. The method according to claim 4, further comprising communicating said soft-decision bits extracted from said codeword segments to a plurality of outer decoding engines.

6. The method according to claim 5, further comprising concurrently processing said soft-decision bits extracted from said codeword segments in said plurality of outer decoding engines to generate at least one soft-decision bit from each of said plurality of outer decoding engines.

7. The method according to claim 6, further comprising concatenating a set of said soft-decision bits generated by said plurality of outer decoding engines to form a codeword segment.

8. The method according to claim 7, further comprising concurrently writing said codeword segment to a plurality of permutation buffer memories.

9. The method according to claim 8, further comprising:
   repeating said processing, concatenating, and writing steps to respectively generate and store a plurality of said codeword segments so that said plurality of codeword segments is duplicated in each of said plurality of permutation buffer memories.

10. The method according to claim 9, further comprising permuting said codeword segments and extracting soft-decision bits from said codeword segments for said plurality of inner decoding engines.

11. The method according to claim 10, wherein said permuting step further comprises a plurality of memory read accesses, and said memory read accesses are distributed among said plurality of permutation buffer memories.

12. A serial concatenated convolutional code decoder, comprising:
   an input buffer memory having a codeblock comprised of a plurality of codeblock segments stored therein;
   a plurality of inner decoding engines configured for concurrently receiving respective soft-decision bits from a respective one of said plurality of codeblock segments and configured for concurrently processing said respective soft-decision bits associated with each of said plurality of codeblock segments to generate at least one soft-decision bit from each of said plurality of inner decoding engines; and
   a first concatenating device configured for concatenating a set of soft-decision bits generated by said plurality of inner decoding engines to form a codeword segment and configured for concurrently writing said codeword segment to a plurality of depermutation buffer memories.

13. The serial concatenated convolutional code decoder according to claim 12, wherein said first concatenating device is further configured for generating a plurality of codeword segments and configured for writing said plurality of codeword segments to said plurality of depermutation buffer memories so that said plurality of codeword segments is duplicated in each of said plurality of depermutation buffer memories.

14. The serial concatenated convolutional code decoder according to claim 13, further comprising a plurality of first deconcatenating devices configured for retrieving a plurality of codeword segments from a respective one of said plurality of depermutation buffer memories in an order different from an order in which said plurality of codeword segments were written to said respective one of said plurality of depermutation buffer memories for storage.

15. The serial concatenated convolutional code decoder according to claim 14, wherein said plurality of first deconcatenating devices are further configured for extracting soft-decision bits from said codeword segments for a plurality of outer decoding engines.

16. The serial concatenated convolutional code decoder according to claim 15, wherein said plurality of first deconcatenating devices are further configured for communicating said soft-decision bits extracted from said codeword segments to said plurality of outer decoding engines.

17. The serial concatenated convolutional code decoder according to claim 16, wherein said plurality of outer decoding engines are configured for concurrently processing said sot-decision bits extracted from said codeword segments to generate at least one soft-decision bit from each of said plurality of outer decoding engines.

18. The serial concatenated convolutional code decoder according to claim 17, further comprising a second concatenating device configured for concatenating a set of said soft-decision bits generated by said plurality of outer decoding engines to form a codeword segment.

19. The serial concatenated convolutional code decoder according to claim 18, wherein said second concatenating device is further configured for concurrently writing said codeword segment to a plurality of permutation buffer memories.

20. The serial concatenated convolutional code decoder according to claim 19, wherein said second concatenating device is further configured for generating a plurality of codeword segments and configured for writing said plurality of codeword segments to said plurality of permutation buffer memories so that said plurality of codeword segments is duplicated in each of said plurality of permutation buffer memories.

21. The serial concatenated convolutional code decoder according to claim 20, further comprising a plurality of second deconcatenating devices configured for retrieving a plurality of codeword segments from a respective one of said plurality of permutation buffer memories in an order different from an order in which said plurality of codeword segments were written to said respective one of said plurality of permutation buffer memories for storage.

22. The serial concatenated convolutional code decoder according to claim 21, wherein said plurality of second deconcatenating devices are further configured for extracting soft-decision bits from said codeword segments for a plurality of inner decoding engines.

* * * * *